United States Patent [19]

Bednorz et al.

[11] Patent Number: 4,684,206

[45] Date of Patent: Aug. 4, 1987

[54] LIGHT WAVEGUIDE WITH A SUBMICRON APERTURE, METHOD FOR MANUFACTURING THE WAVEGUIDE AND APPLICATION OF THE WAVEGUIDE IN AN OPTICAL MEMORY

[75] Inventors: Johannes G. Bednorz, Adliswil; Winfried Denk, Zurich; Martin Lanz; Wolfgang D. Pohl, both of Adliswil, all of Switzerland

[73] Assignee: International Business Machines Corporation, Armonk, N.Y.

[21] Appl. No.: 563,715

[22] Filed: Dec. 20, 1983

[30] Foreign Application Priority Data

Dec. 27, 1982 [EP] European Pat. Off. ........ 82111975.7

[51] Int. Cl.$^4$ .................... G02B 6/10; B29D 11/00; B23P 15/00
[52] U.S. Cl. ........................... 350/96.12; 350/96.10; 350/96.34; 350/319; 350/320; 264/1.1; 264/1.9; 264/1.7; 156/644; 156/645
[58] Field of Search ................ 264/1.1, 1.3, 1.4, 1.7, 264/1.9, 2.7; 350/96.10, 96.11, 96.12, 96.15, 96.20, 96.29, 96.30, 96.33, 96.34, 319, 320; 357/65, 71; 250/227; 372/4, 6, 7, 44, 43, 108; 156/644, 625, 634

[56] References Cited

U.S. PATENT DOCUMENTS

| | | | |
|---|---|---|---|
| 3,235,672 | 2/1966 | Beguin | 350/96.29 |
| 3,237,012 | 2/1966 | Treffeisen | 350/96.10 |
| 3,244,776 | 4/1966 | Sheldon | 350/96.10 X |
| 4,395,775 | 7/1983 | Roberts et al. | 350/319 X |
| 4,520,485 | 5/1985 | Sugino et al. | 350/96.12 |
| 4,604,520 | 8/1986 | Pohl | 350/319 X |

FOREIGN PATENT DOCUMENTS 2256425  5/1974  Fed. Rep. of Germany ... 350/96.29

OTHER PUBLICATIONS

Fitzgerald, "Self-Image and Enlarging Lens" IBM Tech. Discl. Bull., vol. 18, No. 12, May 1976, p. 4174.

Primary Examiner—William L. Sikes
Assistant Examiner—Brian M. Healy
Attorney, Agent, or Firm—Jackson E. Stanland

[57] ABSTRACT

This light waveguide consists of an optically transparent body cut at one end to a sharp tip and polished optically flat at the other end. A metallization layer on its surface is thick enough to be opaque. By pressing the waveguide against a rigid plate the metallization is plastically deformed so as to expose a tiny aperture at the tip of the body through which light can pass. By carefully controlling the deformation of the metallization the diameter of the aperture can be kept between 10 and 500 nm. The waveguide can be incorporated in a semiconductor laser of a read/write head used in an optical storage device.

11 Claims, 8 Drawing Figures

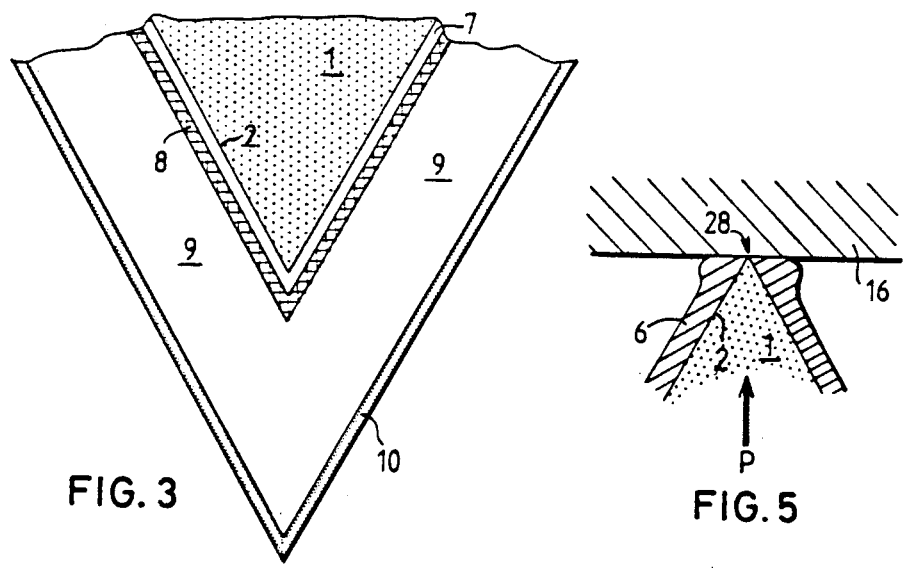
FIG. 3
FIG. 5
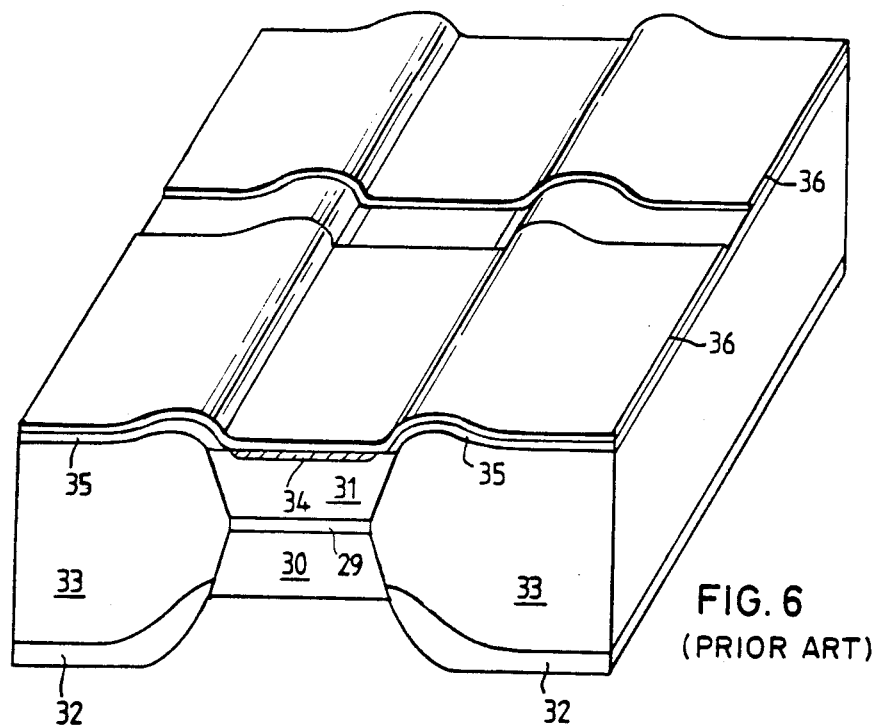
FIG. 6
(PRIOR ART)

LIGHT WAVEGUIDE WITH A SUBMICRON APERTURE, METHOD FOR MANUFACTURING THE WAVEGUIDE AND APPLICATION OF THE WAVEGUIDE IN AN OPTICAL MEMORY

TECHNICAL FIELD

The invention relates to a pointed light waveguide with a submicron aperture, a method for manufacturing the waveguide and an optical memory employing it.

CROSS REFERENCE TO RELATED APPLICATION

A waveguide with an aperture having a diameter less than 1 µm and its use in optical microscopes to improve resolution are described in copending European Patent Publication no. entitled "Optical Near-Field Scanning Microscope", which was filed in Europe on the same day as the present application and has a U.S. counterpart Ser. No. 563,722, filed Dec. 20, 1983, now U.S. Pat. No. 4,604,520.

BACKGROUND ART

In accordance with theories known since the work of Abbé and Rayleigh, diffraction is the cause for the principal limitation of the resolving power achieveable with optical systems, where the resolving power is defined by the wavelength of the radiation and by the numerical aperture of the system employed.

The limitation mentioned above also applies to optical memories where bit density is limited by the optical resolution, which in turn is limited by the smallest diameter to which a laser beam can be focussed. Since this approximately corresponds to one wavelength, the theoretical storage density using a 600 nm laser beam is of the order of $10^8$ bit/cm².

Optical memories are well known. Reference is made to Taschenbuch Elektrontechnik, Bd. 4, München 1979, p. 638. A narrowly focussed laser beam is directed onto a picture point of the storage medium in accordance with a specified address, in order to write, read or cancel information. For writing, the information may, e.g., be represented by the modulation superimposed on the laser beam for changing the physical properties of the storage medium. For reading, the laser beam as reflected by, or passing through, the addressed picture point of the storage medium is analyzed by a detector which issues an output signal representative of the information stored. A typical arrangement of an optical disk memory is shown in FIG. 18 of the paper by C. Harder, K. Y. Lan and A. Yariv "Bistability and Pulsation in Semiconductor Lasers with Inhomogeneous Current Injection", IEEE J. QE-18, No. 9 (1982), pp. 1351–1361.

An improvement regarding the storage density of optical memories is only possible if the laser beam can be restricted to an area smaller than is feasible with conventional means. It is one aspect of the present invention to describe an improved optical aperture the diameter of which is smaller than one wavelength of the laser light used. Apertures of this size have so far not been disclosed (other than in the aforementioned related application) as their manufacture has not been envisaged before, and generally because they are not useful in imaging optics.

The present invention contemplates the creation of an aperture of submicron size by means of a sharp crystal covered with an opaque coating and with said coating removed at the tip so as to expose a tiny area of the crystal through which the light can pass. A crystal used as an enlarging lens is known from an article by T. S. Fitzgerald entitled "Self-Image and Enlarging Lens", IBM Technical Disclosure Bulletin, Vol. 18, No. 12, May 1976, p. 4174, in which an inverted pyramid-shaped lens is used for enlarging an image recorded on photographic film and displaying the enlarged image on its frosted base surface. However, this crystal does not have a metal coating, nor is its optical behaviour relevant to the waveguide of the present invention.

DISCLOSURE OF INVENTION

The invention relates to a pointed light waveguide with an aperture having a diameter less than 1 µm, to a method for manufacturing the waveguide, and to an application of the waveguide in an optical memory.

The waveguide is characterized in that its body is sharply pointed at one end to form a tip and polished optically flat at the other end. The body is covered by material forming an opaque film, and the opaque film at the tip of the body is recessed to such an extent that an aperture is formed in the opaque film, the diameter of the aperture being smaller than 500 nm, and typically of the order of 10 nm.

The method for manufacturing the waveguide is characterized by cutting a transparent crystal body to the desired size, preparing a conical tip at one end thereof with an angle of approximately 60 degrees, polishing the other end optically flat, etching the tip of the crystal body to form a sharply pointed apex, covering the crystal body with an opaque film coating, and mechanically recessing the opaque coating so as to expose a region on the apex of the crystal body to form an aperture having a diameter <500 nm.

The application of the waveguide in an optical memory is characterized in that it is mounted on an arm for axial displacement across a rotatable record medium, with the aperture facing the recording tracks on the medium and at a constant distance therefrom, for accessing individual storage positions on the medium in order to write, read and/or cancel information in accordance with the applied modulation.

These and other objects, features, and advantages will be apparent from the following more particular description of the preferred embodiments.

BRIEF DESCRIPTION OF THE DRAWINGS

Details of embodiments of the invention will be explained in the following description with reference to the attached drawings in which:

FIG. 3 is a cross section of an idealized tip of a metallized waveguide.

FIG. 5 shows the tip of the waveguide after plastic deformation of the metallization coating it.

FIG. 6 is a cross sectional view of a prior art semiconductor laser.

BEST MODE FOR CARRYING OUT THE INVENTION

Figure 1:
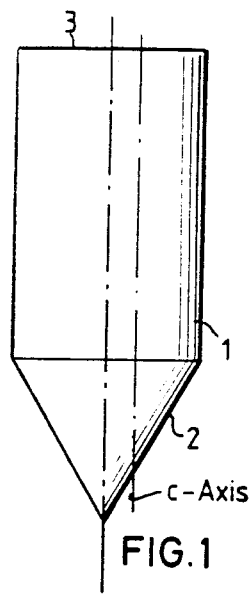
FIG. 1 is a schematic representation of a crystal from which the waveguide is manufactured.

FIG. 1 shows an optically highly transparent crystal rod 1 which may be quartz or the like. The size of rod 1 at the outset of the manufacturing process may be, e.g., 15×2×2 nm or smaller. The axis of the rod may be aligned parallel to the crystal c-axis. By grinding one end of the rod, a control tip 2 with an apex angle of 60° is formed, while the other end 3 is polished optically flat.

Figure 2:
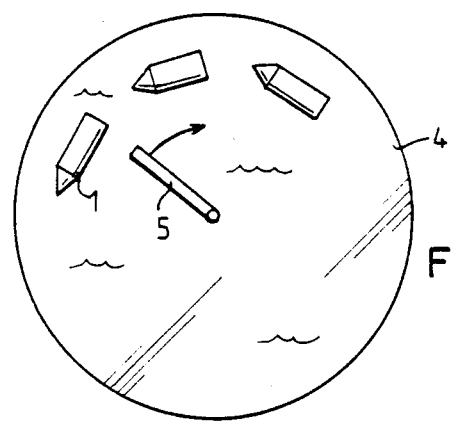
FIG. 2 is a top plan view of an etching step in the manufacture of the waveguide.

Rod 1 is then mounted in a closed beaker 4 (FIG. 2) filled with hydrofluoric acid (HF, 48% by vol, for example). A stirrer 5 is rotated inside beaker 4 so as to stir the acid to flow against the tip 2 of rod 1. After a short period of etching, smooth equilibrium surfaces develop which form a sharply pointed apex at the tip of rod 1. One or more secondary apices might occur due to dislocations in the crystal. However, they will be clearly recessed from the main apex and will not impair the performance of the completed waveguide.

In a further step, rod 1 is covered with an opaque metal film 6 (see, e.g., FIG. 5), except for the polished surface at its rear end 3. The metallization is preferably performed by an evaporation process during which the rod is moved to ensure uniform coverage. Best results have been obtained with a composite four-layer metal film (FIG. 3) which consists of a first layer 7 of about 5 nm of chromium which serves to provide good adhesion of the following layers to the quartz surface: a second layer 8 of about 5 nm of gold, which allows for inspection in a scanning electron microscope prior to applying a third layer 9 consisting of aluminum and having a thickness between 500 and 1000 nm and providing an opaque coating around the quartz rod, and finally a fourth layer 10 consisting of gold for protecting the aluminum layer 9 against oxidation.

Figure 4:
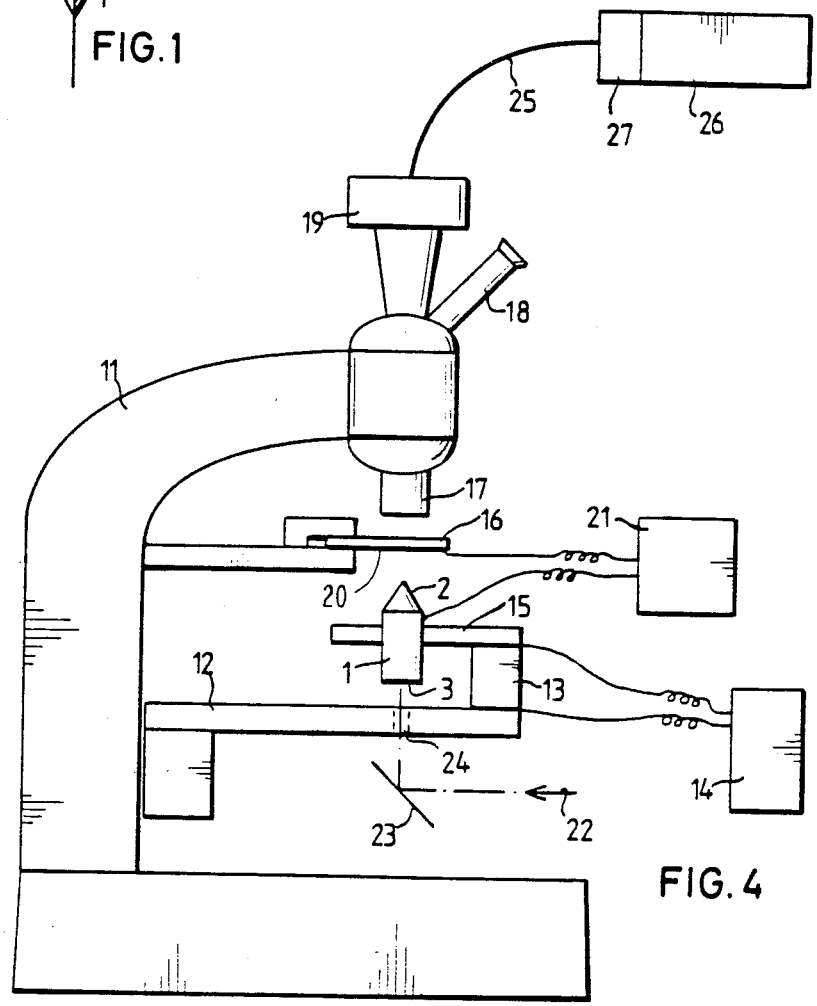
FIG. 4 schematically shows the use of a microscope apparatus to form the aperture.

The next step in the manufacture of the waveguide is the formation of the aperture at the tip 2 of rod 1. There are several methods available, such as ion milling, for example, but the best result was obtained with the following method in accordance with which the waveguide rod is pressed against a hard, rigid plate in a well-controlled way. FIG. 4 shows an apparatus for doing this.

In FIG. 4, rod 1 is mounted on a combined mechanical and piezoelectric vertical translation stage in a conventional microscope 11. The vertical translation stage 12 is equipped with a stack 13 of piezoelectric crystals which are connected to a programmable high voltage source 14 for applying a potential across stack 13 so as to cause appropriate variations of its vertical dimension. Fixed to stack 13 is a table 15 for clamping rod 1 in an upright position. Arranged over rod 1 is a plate 16 rigidly mounted to the body of microscope 11. Above plate 16 is the optical part of the microscope, viz. objective 17, eyepiece 18, and a photo attachment 19.

Plate 16 may consist of a microscope slide coated on its lower surface with a metal film 20, which may be gold, for example. Metal film 20 and the metallization 6 on rod 1 are connected to a voltage source 21 for applying a potential thereto.

A laser beam 22, such as from a blue argon laser, is fed into rod 1 from its end 3 via a mirror 23 and a hole 24 in stage 12. No light can leave waveguide rod 1 since its walls and tip 2 are coated and are therefore opaque.

The end of a glass fiber cable 25 is mounted centrally in the image plane of photo attachment 19 and connects to a photomultiplier 26 equipped with an interference filter 27 matched to the laser wavelength to prevent light from the microscope lamps from reaching photomultiplier 26.

Maximum potential (ca. 1.2 kV) is now applied across the stack 13 of piezoelectric crystals causing the stack to vertically contract.

Waveguide rod 1 is then moved toward plate 16 to within a distance of <10 μm from it by mechanical translation stage 12. The microscope is then focussed onto tip 2 of waveguide rod 1 such that the image of tip 2 falls onto the end of glass fiber cable 25.

The final movement of rod 1 is made by means of the piezoelectric stack. The voltage from source 14 is controlled electronically in one of two modes. In the first mode, as long as there is no electrical contact between rod 1 and plate 16, the voltage from source 14 is slowly decreased. This will result in a reduction of the distance between rod 1 and plate 16 by about 1 μm/150V. The voltage decrease is continued until a contact signal is received or the minimum voltage is reached.

In the latter case, the voltage is simply set back to its maximum value and the distance between tip 2 and plate 16 is decreased manually by two to four micrometers (which is easy to do), and the procedure is repeated. When a contact signal occurs, the voltage is immediately increased by a small amount, resulting in a minute withdrawal of tip 2 from plate 16, and then set constant. Tip 2 is now extremely close to plate 16 and ready to be pressed against the plate in a defined way.

In the second mode, voltage source 14 will slowly decrease the voltage across stack 13. When the contact signal occurs, the decrease is continued by a predetermined small amount. Thereupon the voltage is increased again to pull tip 2 back. This process is repeated several times with increasing voltage steps, until the control of voltage source 14 is returned to its first mode.

During the period of contact, a high pressure is exerted upon tip 2, owing to the small contact area thereof. This pressure is strong enough for metal film 6 to become plastically deformed and to change its originally spherical shape to an essentially flat, plane configuration. FIG. 5 shows the (exaggeratedly sharp) apex of tip 2 just having reached plate 16, with the metallization having been forced to flow to take a pestle-like shape around the apex of the crystal. A tiny optical aperture 28 is formed this way, through which the laser light can leave the waveguide rod 1. As a result of this, a very small, weak light dot can be observed in the microscope. The laser light 22 now reaches photomultiplier 26 and can be used to finish the pressing step to form an aperture of the desired size.

An inspection of the tips of various waveguide rods under an electron microscope has shown that the tips of the rods indeed have a flat configuration with a central opening.

The manufacturing process described so far lends itself to the incorporation of the aperture into a semiconductor laser. This is advantageous in that no optical connection, such as a glass fiber cable, is required between a separate laser and the aperture. Also, the entire unit can be made extremely small with very small mass, which is important in optical memory applications, as will be described below.

Semiconductor lasers per se are known in the art. For their principles reference is made to the book "Laser"

by D. Ross, Frankfurt 1966, p. 67 ff. The lasing zone of a semiconductor laser is thin in one dimension. It consists of the amplifying junction of typically $\leq 2$ μm thickness sandwiched between two transparent layers. The total thickness of the three layers must exceed the wavelength, approximately 500 μm inside the medium, and usually is a few μm. A typical design based on a recent publication by C. Harder, K. Y. Lau and A. Yariv, "Bistability and Pulsations in Semiconductor Lasers with Inhomogeneous Current Injection", in IEEE J. QE 18, No. 9, p. 1351, is shown in FIG. 6.

Briefly, the amplifying junction 29 is buried between transparent layers 30 and 31 respectively of p⁻and n type semiconductor materials. To the sides of layers 30 and 31 there is bulk material of the n⁻and p⁻types designated 32 and 33, respectively. Diffused into transparent layer 31 is a zinc layer 34. An insulating $SiO_2$ layer 35 covers the tops of bulk material 33 and also covers those portions of transparent layer 31 where it does not carry the diffused zinc layer 34. The latter is contacted by a segmented Cr-Au layer 36 to which the energy is applied. In operation, laser light will be emitted from the device at the front from amplifying junction 29.

While in the cited reference the total thickness of layers 29 through 31 was chosen to be 3.2 μm, it is preferred for the present purpose to compress the design to 1 μm —which is rather easy to manufacture.

Figure 7:
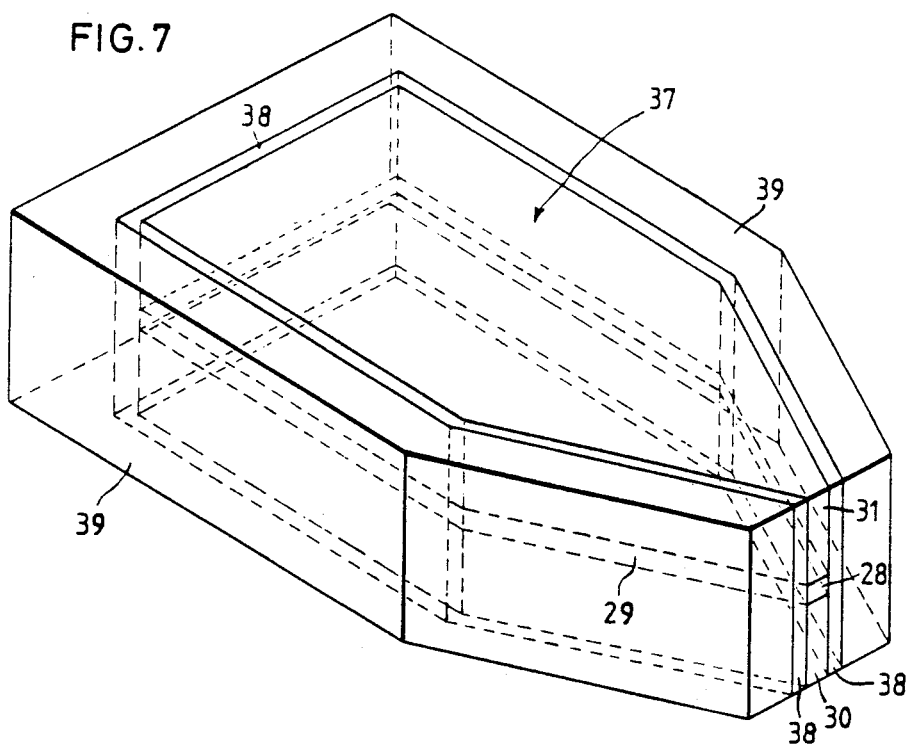
FIG. 7 is a perspective view of a semiconductor laser having a waveguide in accordance with the invention incorporated into it.

An aperture of the type described above can be incorporated immediately into the semiconductor laser as shown in FIG. 7. The body 37 of the laser is given a pointed shape by cleaving, polishing and/or etching. It is then coated with a thin insulating layer 38 which in turn is covered by a comparatively thick opaque layer 39, preferably metal. At its apex, semiconductor body 37 is freed of the insulating and metal layers 38 and 39, respectively, so as to expose lasing junction 29 to permit the laser light to exit. The roof shape shown in FIG. 7 is sufficient since the zone forming the aperture may have a slit shape. The apex structure may of course be formed by controlled pressing of body 37 against a rigid plate as described above in connection with quartz rod 1.

The aperture, though extremely small, covers a sizeable fraction of the lasing zone so that a fair amount of the laser power can be extracted. The top and bottom surfaces of the laser of FIG. 7 carry appropriate electrodes (not shown) for applying the necessary pumping pulses.

With the aperture 28 of the semiconductor laser having a dimension smaller than the wavelength of the laser light, a considerable improvement in optical memories becomes possible. With conventional optical memories such as shown in the referenced Harder et al. paper, fast addressing of the storage positions on a memory disk has been problematic since the part of the optical system comprising the laser, focusing lens and mirror must be moved axially with respect to the rotating disk for addressing individual tracks thereon. The speed with which this can be accomplished is of course limited by the mass to be moved.

Figure 8:
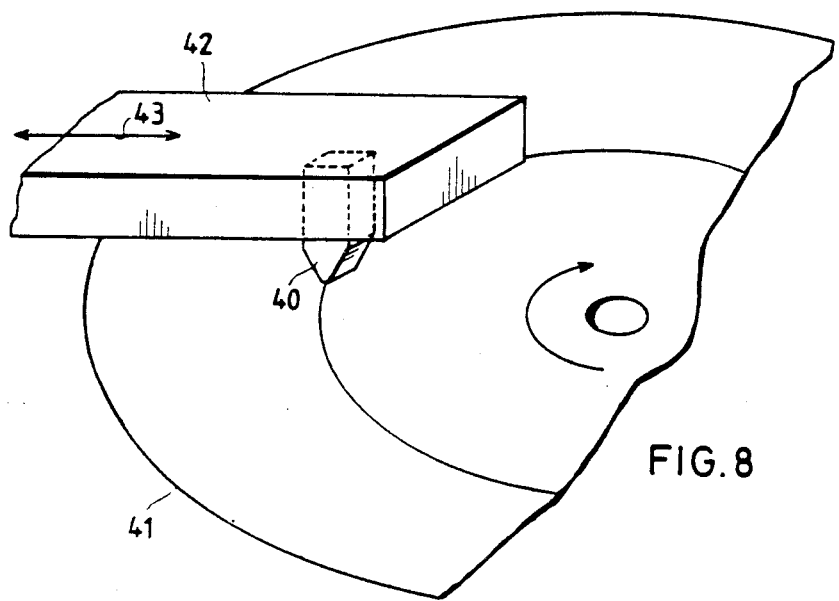
FIG. 8 shows the principle parts of an optical memory embodying semiconductor laser of FIG. 7.

FIG. 8 shows an arrangement where the semiconductor laser 40, equipped with the aperture 28 according to the present invention, is suspended over the recording surface of an optical disk 41. Laser 40 is attached to an arm 42 which can be moved in the direction of arrow 43 by conventional means not shown. The distance of aperture 28 from the surface of disk 41 can be controlled (with conventional means known from magnetic disk storage) to values below the wavelength of light.

The application of the waveguide in accordance with the present invention, viz. in a near-field optical scanning microscope as described in the above-mentioned co-filed application, requires that no metallization be present on the end surface 3 of the waveguide to permit optical connection thereof to an optical glass fiber, an optical filter, or the like, whereas the semiconductor laser preferentially is metallized at its surface opposite the aperture 28.

Metallization of the rear side is straight forward with conventional evaporation techniques.

While the invention has been described with respect to preferred embodiments thereof, it will be apparent to those of skill in this art that variations may be made therein which are within the spirit and scope of the invention.

Having thus described our invention, what we claim as new and desire to secure by Letters Patent is:

1. A light waveguide consisting of an optically transparent needle-shaped crystal body having side walls extending along the general propagation direction of light through said body and first and second ends, said body covered with a reflective material, one end of said body being sharply pointed forming a tip thereat, said other end being optically flat, said reflective material having a deformation pressed therein forming an aperture in said reflective film, the diameter of said aperture being less than 500 nm.

2. The light waveguide of claim 1, characterized in that the transparent body is comprised of a semiconductor laser having a light emitting amplifying junction therein, said body being covered with a metal film separated from said body by an insulating layer, and wherein said aperture in said metal film is aligned with an edge of said amplifying junction of the laser.

3. The light waveguide of claim 1, where said opaque film is comprised of multiple layers.

4. The light waveguide of claim 3, where said opaque film includes a metallic layer.

5. The light waveguide of claim 3, where said waveguide is comprised of crystal coated with said opaque film, said film being comprised of a first layer of chromium, a second layer of gold, a third layer (9) of aluminum, and of a fourth layer of gold.

6. A method for manufacturing a light waveguide, characterized by cutting a transparent crystal body to the desired size, preparing a conical tip at one end thereof with an angle of approximately 60 degrees, and polishing the other end optically flat, etching said tip to form a sharply pointed apex, covering said crystal body with an opaque film and mechanically deforming said opaque coating to expose a region on said apex, thereby forming an aperture having a diameter between 10 and 500 nm.

7. The method of claim 6, characterized in that said opaque film is comprised of an insulating layer on which a metal film is deposited, and including an aperture forming step in which said metal-coated body is pressed against a rigid plate so as to plastically deform said metal film to such an extent that a metallization-free region on said apex is exposed.

8. The method of claim 6, characterized in that during the mechanical deformation of the opaque coating the transmission of light through the crystal body is monitored by means of a laser beam and a photodetector to at least approximately determine the diameter of the aperture from the number of light quanta received at the photodetector.

9. The method of claim 6, characterized in that the mechanical deformation of the opaque film is accomplished in a microscope set-up by first coarsly approaching the crystal body to a plate to within about 10 μm, focussing the microscope onto the tip of said crystal body finely approaching the tip to the plate to just reach contact, and then pressing the tip against the plate and withdrawing the tip from the plate in repeated cycles until the aperture at the tip has reached the desired size.

10. The method of claim 6, characterized in that the preparation of the tip includes the steps of grinding the cleaved crystal body at one end to obtain a $\leq 60°$ roof shape, and etching the tip in an appropriate etchant to form a sharply pointed apex.

11. The method of claim 6, where said opaque film is comprised of a first layer of chromium, a second layer of gold, a third layer of aluminum, and a fourth layer of gold.

* * * * *